(12) United States Patent  
Gambino et al.

(10) Patent No.: US 8,796,130 B2  
(45) Date of Patent: Aug. 5, 2014

(54) DIFFUSION BARRIER FOR OPPOSITELY DOPED PORTIONS OF GATE CONDUCTOR

(75) Inventors: Jeffrey P. Gambino, Westford, VT (US); Russell T. Herrin, Essex Junction, VT (US); Mark D. Jaffe, Shelburne, VT (US); Laura J. Schutz, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 13/352,851

(22) Filed: Jan. 18, 2012

(65) Prior Publication Data

US 2013/0181293 A1  Jul. 18, 2013

(51) Int. Cl.  
    *H01L 21/3205* (2006.01)
(52) U.S. Cl.  
    USPC ....... 438/592; 438/199; 438/229; 257/E21.19
(58) Field of Classification Search  
    CPC .............. H01L 21/823807; H01L 21/823842; H01L 21/823814  
    USPC ............. 438/199, 229, 230, 592; 257/E21.19  
    See application file for complete search history.

(56) References Cited

U.S. PATENT DOCUMENTS

| | | |
|---|---|---|
| 5,550,079 A | 8/1996 | Lin |
| 6,174,807 B1 | 1/2001 | Kizilyalli et al. |
| 6,342,438 B2 | 1/2002 | Yu et al. |
| 6,451,704 B1 | 9/2002 | Pradeep et al. |
| 6,593,631 B2 | 7/2003 | Lee et al. |
| 6,800,512 B1 * | 10/2004 | Itonaga et al. ............ 438/154 |
| 6,812,086 B2 | 11/2004 | Murthy et al. |
| 6,812,529 B2 | 11/2004 | Trivedi et al. |
| 7,064,399 B2 | 6/2006 | Babcock et al. |
| 7,166,896 B2 | 1/2007 | Tang et al. |

OTHER PUBLICATIONS

U. Schwalke et al., "Advanced Gate-Stack Architecture for Low-Voltage Dual-Workfunction CMOS Technologies with Shallow Trench Isolation,"Digest of Technical Papers, 1997 Symposium on VLSI Technology, Jun. 10-12, 1997, pp. 71-72.  
C.-H. Shih et al., "A Dual Workfunction Gate for Thin-Gate-Insulator Schottky-Barrier MOSFETs," IEEE Transactions on Electron Devices, vol. 55, No. 9, Sep. 2008, pp. 2521-2525.

* cited by examiner

*Primary Examiner* — Jack Chen  
(74) *Attorney, Agent, or Firm* — Gibb & Riley, LLC; Michael J. LeStrange, Esq.

(57) ABSTRACT

A method patterns a polysilicon gate over two immediately adjacent, opposite polarity transistor devices. The method patterns a mask over the polysilicon gate. The mask has an opening in a location where the opposite polarity transistor devices abut one another. The method then removes some (a portion) of the polysilicon gate through the opening to form at least a partial recess (or potentially a complete opening) in the polysilicon gate. The recess separates the polysilicon gate into a first polysilicon gate and a second polysilicon gate. After forming the recess, the method dopes the first polysilicon gate using a first polarity dopant and dopes the second polysilicon gate using a second polarity dopant having an opposite polarity of the first polarity dopant.

18 Claims, 8 Drawing Sheets

DIFFUSION BARRIER FOR OPPOSITELY DOPED PORTIONS OF GATE CONDUCTOR

BACKGROUND

The present disclosure relates to transistor devices, and more specifically, to transistor devices that utilize a gate conductor that includes sections that are doped in different manners and to a diffusion barrier for use between such sections of the gate conductor.

Within a transistor, a semiconductor (or channel region) is positioned between a conductive "source" region and a similarly conductive "drain" region. When the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

In complementary metal oxide semiconductor (CMOS) devices, immediately adjacent transistors are "complementary" to one another, meaning that the adjacent transistors have opposite polarities (one is a positive-type (P-type) and the other is negative-type (N-type)). To increase manufacturing efficiency, a single polysilicon gate is formed over these complementary adjacent transistors, and different portions of the polysilicon gate are subjected to opposite doping regimes to allow each different transistor to have a gate conductor that has a doping polarity appropriate for the polarity of the underlying channel region.

However, the polysilicon gate is often pre-doped at a very high dose. This doping is done before gate etching and anneals associated with the source/drain diffusions. An issue has been observed in very tight ground rule layouts where the dopants diffuse into opposite polarity regions of the gate conductor. If N-type doping gets into the gate over the positive type transistor or P-type doping gets into the gate over the negative type transistor, large gate depletion can occur, which causes significant transistor performance issues.

SUMMARY

One exemplary method embodiment herein patterns a polysilicon gate over two immediately adjacent, opposite polarity transistor devices. The method patterns a mask over the polysilicon gate. The mask has an opening in a location where the opposite polarity transistor devices abut one another. The method then removes some (a portion) of the polysilicon gate through the opening to form at least a partial recess (or potentially a complete opening) in the polysilicon gate. The recess separates the polysilicon gate into a first polysilicon gate and a second polysilicon gate. After forming the recess, the method dopes the first polysilicon gate using a first polarity dopant and dopes the second polysilicon gate using a second polarity dopant having an opposite polarity of the first polarity dopant.

Another embodiment herein patterns a polysilicon gate over two immediately adjacent, opposite polarity transistor devices. The method patterns a mask over the polysilicon gate. The mask has an opening in a location where the opposite polarity transistor devices abut one another. The method can optionally form sidewall spacers in the opening to reduce the size of the opening. The method then removes some (a portion) of the polysilicon gate through the opening to form at least a partial recess (or potentially a complete opening) in the polysilicon gate. The recess separates the polysilicon gate into a first polysilicon gate and a second polysilicon gate. After forming the recess, the method dopes the first polysilicon gate using a first polarity dopant and dopes the second polysilicon gate using a second polarity dopant having an opposite polarity of the first polarity dopant.

An integrated circuit structure embodiment herein comprises a polysilicon gate located over two immediately adjacent, opposite polarity transistor devices. A recess in the polysilicon gate is located where the opposite polarity transistor devices abut one another. The recess separates the polysilicon gate into a first polysilicon gate and a second polysilicon gate. The first polysilicon gate comprises a first polarity dopant, and the second polysilicon gate comprises a second polarity dopant having an opposite polarity of the first polarity dopant.

BRIEF DESCRIPTION OF THE DRAWINGS

The embodiments herein will be better understood from the following detailed description with reference to the drawings, which are not necessarily drawing to scale and in which.

DETAILED DESCRIPTION

As mentioned above, dopants can sometimes diffuse into opposite polarity regions of the gate conductor, which causes significant transistor performance issues. In view of this, the embodiments herein provide a diffusion barrier and associated methodology to help reduce dopants improperly diffusing into adjacent regions of a gate conductor.

Figure 1:
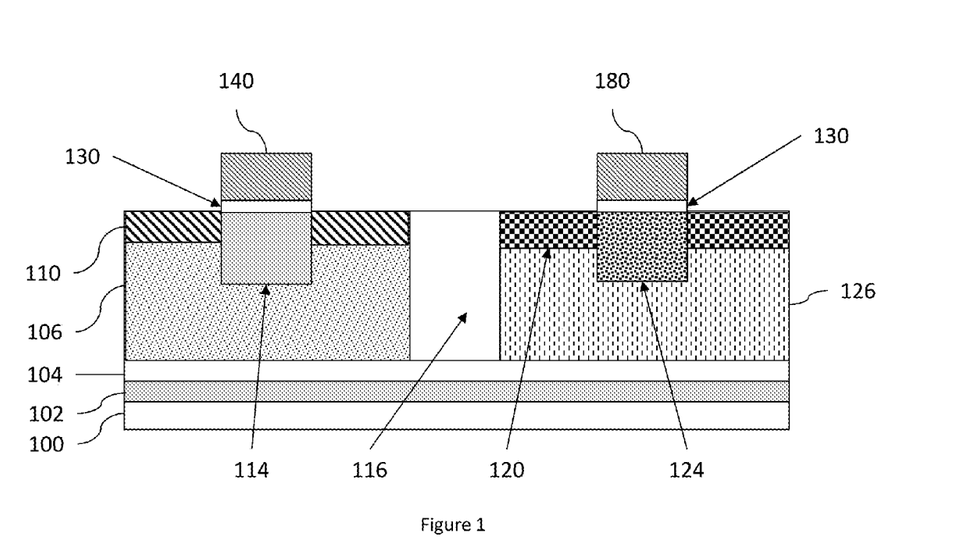
FIG. 1 is a cross-sectional schematic diagram along line B-B' in FIG. 3, illustrating embodiments herein.

More specifically, the cross-sectional schematic diagrams shown in FIGS. 1-15 illustrate various processes and structures herein. FIG. 1 begins by illustrating a partially completed CMOS structure that includes one transistor on the left side of the drawing and a complementary transistor on the right side of the drawing separated by a shallow trench isolation region 116. Shallow trench isolation (STI) structures are well-known to those ordinarily skilled in the art and are generally formed by patterning openings/trenches within the substrate and growing or filling the openings with a highly insulating material (this allows different active areas of the substrate to be electrically isolated from one another).

A silicon-on-insulator (SOI) substrate structure is shown in the drawings and includes an underlying substrate 100, a buried oxide layer 102, and additional substrate material 104. While a SOI substrate is illustrated in the drawings, the embodiments herein are not limited to such a substrate, and as will be understood by those ordinarily skilled in the art, the embodiments herein can be utilized with any form of substrate, such as bulk substrates, etc. Generally, transistor structures are formed by depositing or implanting impurities into the substrate. As used herein, "implantation processes" can take any appropriate form (whether now known or developed in the future) and can comprise, for example, ion implantation, etc.

The upper part of the substrate structure is doped with impurities to form various oppositely doped well or substrate regions 106, 126. The substrate structure herein can comprise any material appropriate for the given purpose (whether now known or developed in the future) and can comprise, for example, Si, SiC, SiGe, SiGeC, etc.

The channel region of each transistor is shown as items 114, 124 and each channel region comprises a semiconductor. For purposes herein, a "semiconductor" is a material or structure that may include an implanted impurity that allows the material to sometimes be a conductor and sometimes be an insulator, based on electron and hole carrier concentration. Again, as would be understood by one ordinarily skilled in the art, these channel regions 114, 124 will be oppositely doped from one another. A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

FIG. 1 also illustrates gate insulators 130 over the channel region 114, 124. The gate insulator 130 insulates the overlying gate conductor 140, 180 from the underlying channel region 114, 124. For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, and metal oxides like tantalum oxide. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant.

Items 110 and 120 represent conductively doped source and drain regions of the different polarity transistors. These are regions that are generally formed after the gate conductor 140, 180 has been formed and are formed using dopants that are consistent with those used to form the various channel regions 114, 124, well regions 106, 126, etc. In some situations, sidewall spacers can be formed on the sides of the gate conductor 140, 180 to control the size of the source and drain regions 110, 120. Further, if desired, various source and drain extensions, halo implants, etc., can be formed using the gate conductor 140, 180 as a mask. While an exemplary structure has been shown in FIG. 1, those ordinarily skilled in the art would understand that FIG. 1 also conceptually illustrates many other similar devices that use an overlying conductor, such as diodes, capacitors, wiring structures, etc.

Figure 2:
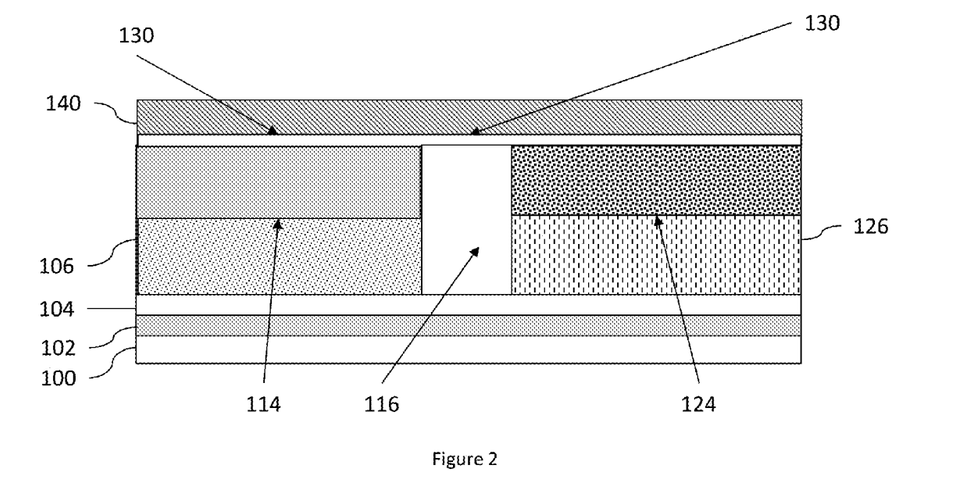
FIG. 2 is a cross-sectional schematic diagram along line A-A' in FIG. 3, illustrating embodiments herein.
Figure 3:
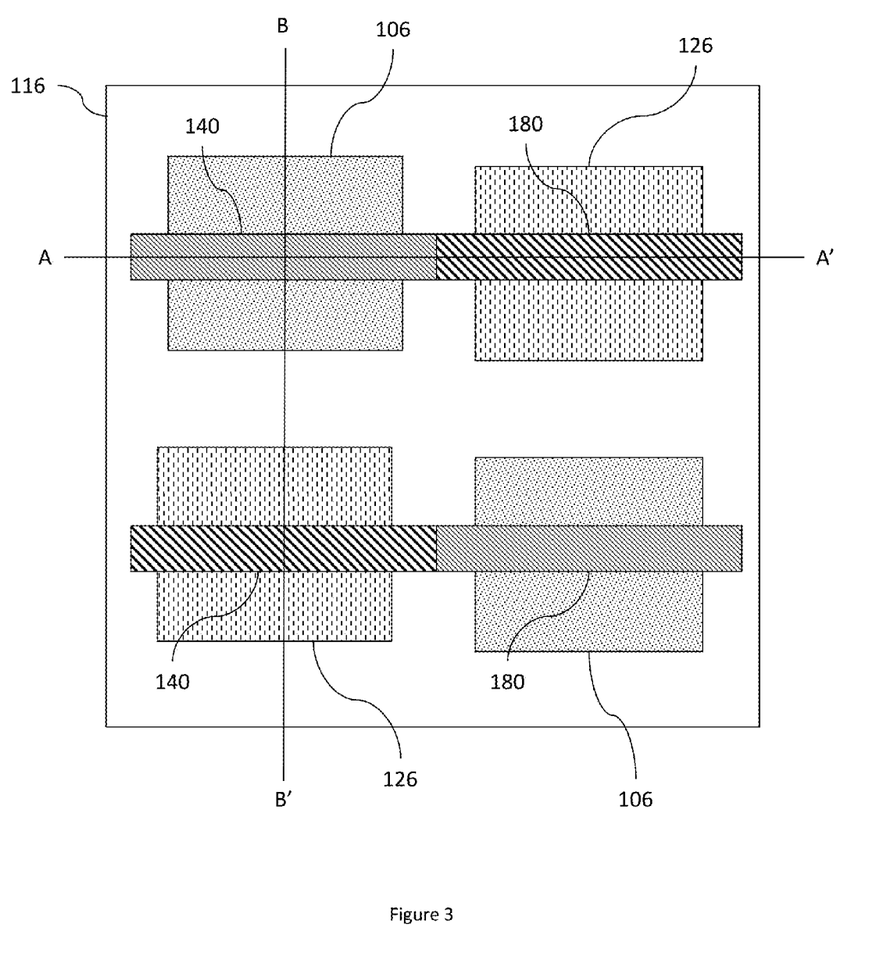
FIG. 3 is a top-view schematic diagram illustrating embodiments herein.

FIG. 1 is a cross-sectional schematic diagram along line B-B' in FIG. 3 and FIGS. 2 and 4-15 are cross-sectional schematic diagram along line A-A' in FIG. 3. Therefore, FIGS. 2 and 4-15 illustrate a cross-sectional view that is rotated 90° from the view shown in FIG. 1 and, therefore, only illustrates one of the gate conductors (140) and does not illustrate source or drain regions 110, 120. The note that the view shown in FIG. 3 intentionally does not illustrate the source or drain regions (110, 120) in order to clearly show the relationships between the channel regions 114, 124 and the gate conductors 140, 180. As shown in FIG. 2, the processes herein patterns the polysilicon gate 140 over two immediately adjacent, opposite polarity transistor devices that are separated by the shallow trench isolation region 116.

Figure 4:
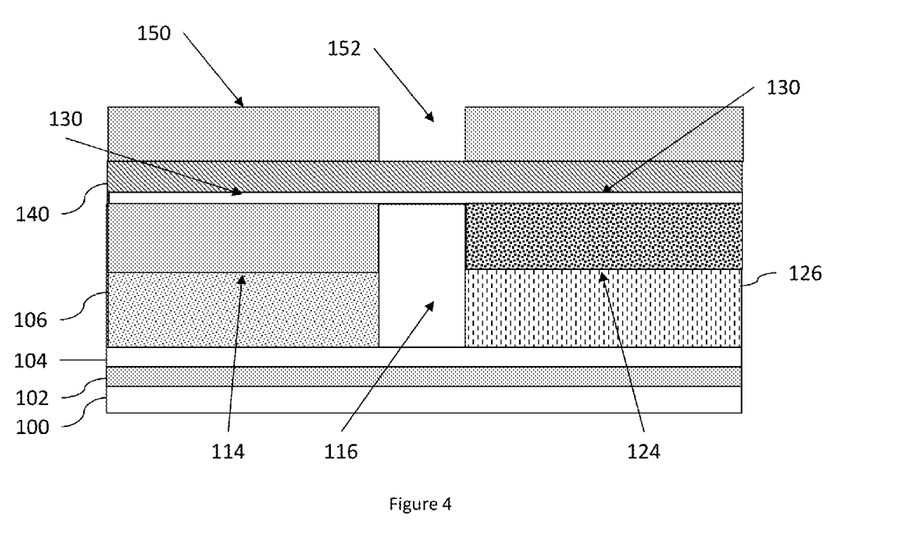
FIG. 4 is a cross-sectional schematic diagram along line A-A' in FIG. 3, illustrating embodiments herein.

Next, as shown in FIG. 4, the method patterns a mask 150 over the polysilicon gate. As would be understood by those ordinarily skilled in the art, the gate conductors 140, 180 illustrated in FIGS. 1 and 3 could be patterned before or after the mask 150 is patterned. Further, the polysilicon gate doping could be performed prior to or after the gate etching and prior to or after the patterning of the mask 150. The masks mentioned herein can be formed of any suitable material, whether now known or developed in the future, such as an organic material. When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Figure 5:
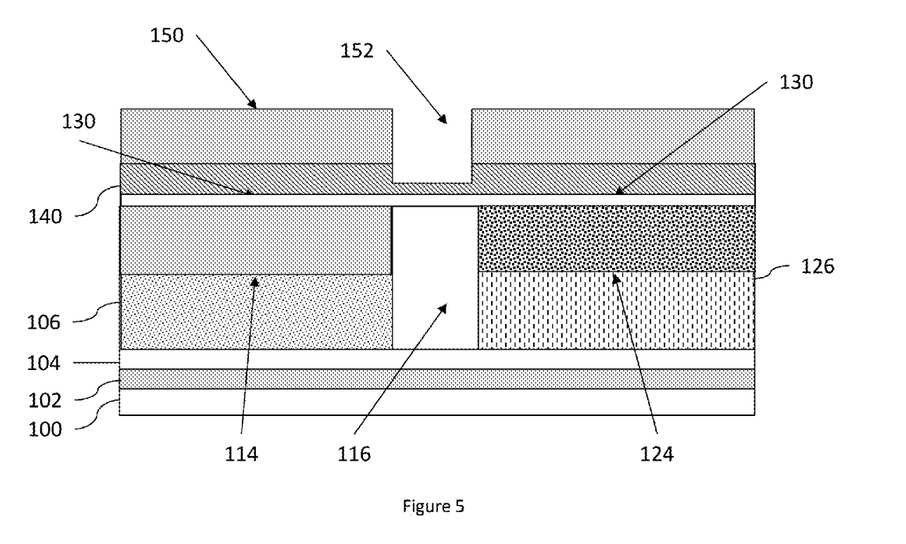
FIG. 5 is a cross-sectional schematic diagram along line A-A' in FIG. 3, illustrating embodiments herein.
Figure 6:
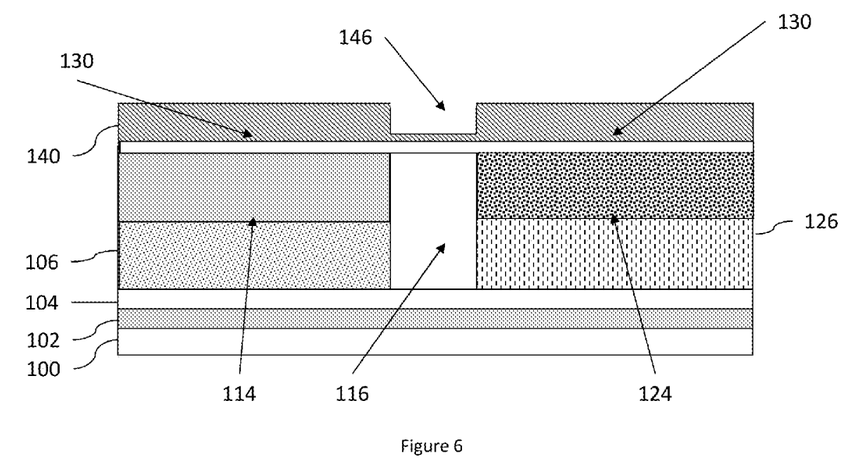
FIG. 6 is a cross-sectional schematic diagram along line A-A' in FIG. 3, illustrating embodiments herein.

The mask 150 has an opening 152 in a location where the opposite polarity transistor devices abut one another, over the shallow trench isolation region 116. As shown in FIG. 5, the method then removes some (a portion) of the polysilicon gate 140 through the opening 152 to form (as shown in FIG. 6) at least a partial recess 146 in the polysilicon gate 140. For example, the process used to remove a portion of the polysilicon gate 140 could comprise etching. More specifically, the power, etchant, and length of the etching process is controlled to remove only a portion of the polysilicon gate 144 and to not form an opening completely through the polysilicon gate 140.

The recesses that are formed herein can extend into the polysilicon gate 140 by any desired amount, so long as they do not create an opening completely through the polysilicon gate. For example, the recesses could be formed into one-half of the thickness of the polysilicon gate 140, three-quarters of the thickness of the polysilicon gate 140, 10%, 35%, 80%, 90% of the thickness of the polysilicon gate, etc. By controlling the material removal process so as to only form a recess (and not form a complete opening) the underlying shallow trench isolation region 116 is fully protected from the material removal process, thereby reducing the number of defects that may occur if a full opening were formed through the entire polysilicon gate 140. The recess 146 separates the polysilicon gate into a first polysilicon gate portion (e.g., left side) and a second polysilicon gate portion (e.g., right side).

Figure 7:
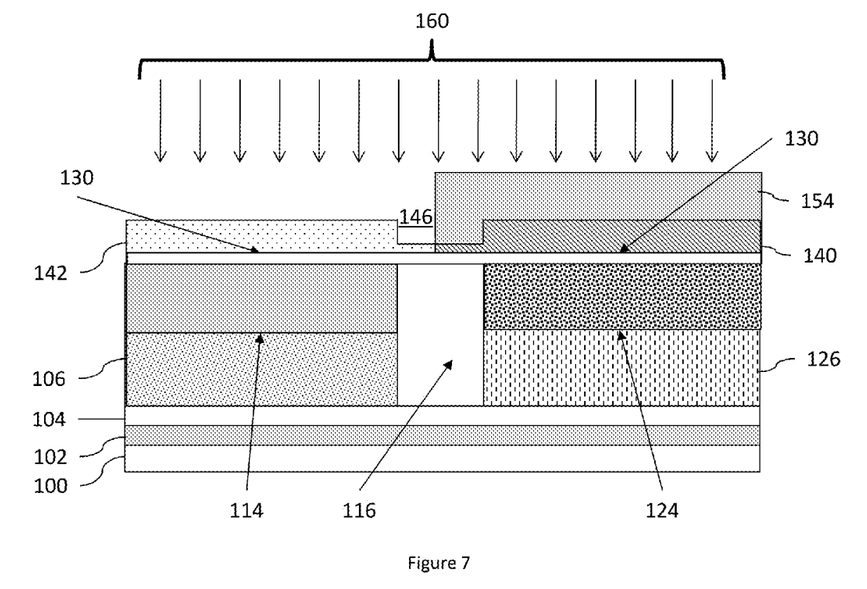
FIG. 7 is a cross-sectional schematic diagram along line A-A' in FIG. 3, illustrating embodiments herein.
Figure 8:
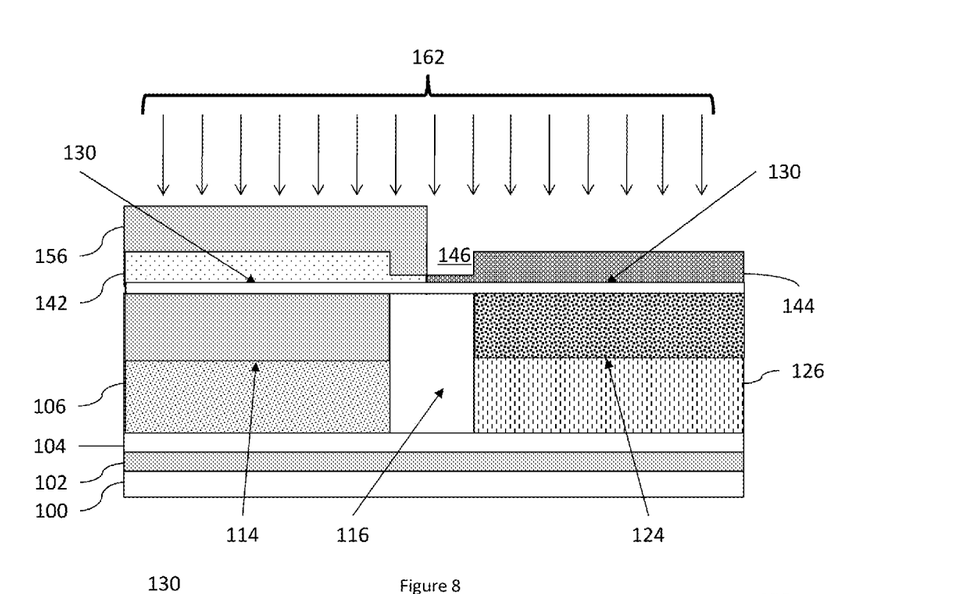
FIG. 8 is a cross-sectional schematic diagram along line A-A' in FIG. 3, illustrating embodiments herein.

After forming the recess 146, the method patterns an additional mask 154 over one of the gate portions and dopes, for example, the first polysilicon gate portion using a first polarity dopant 160 to leave what is referred to herein as the first polysilicon gate 142, as shown in FIG. 7. The previous mask 154 is removed and another mask 156 is formed to protect the first polysilicon gate 142 while an opposite polarity conductive dopant 162 is implanted into the second polysilicon gate portion, as shown in FIG. 8. This leaves the second polysilicon gate portion as what is referred to herein as the second polysilicon gate 144.

Figure 9:
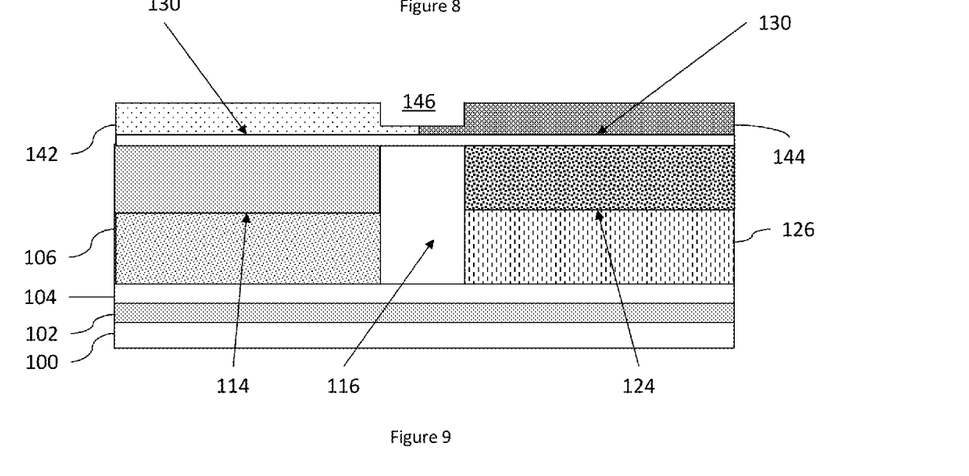
FIG. 9 is a cross-sectional schematic diagram along line A-A' in FIG. 3, illustrating embodiments herein.
Figure 10:
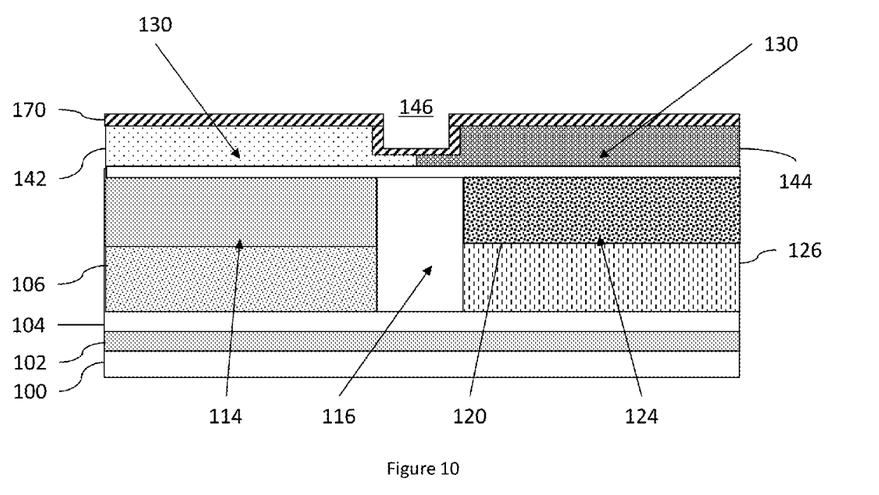
FIG. 10 is a cross-sectional schematic diagram along line A-A' in FIG. 3, illustrating embodiments herein.

After the mask 156 is removed, the structure that remains is shown in FIG. 9. Next, as shown in FIG. 10, the upper portions of the gate conductors 142, 144 are silicided to create a silicide region 170. As is understood by those ordinarily skilled in the art, a silicide process generally involves forming a metal over a silicon material, and then heating the structure to cause the upper portion of the silicon material to absorb some of the metal and become a silicide.

As would be understood by those ordinarily skilled in the art, additional structures can be formed over the silicide layer 170, such as insulator layers, contacts, etc. Further, as mentioned above, various additional implants to form halo regions, source drain extensions, source drain regions, etc. can be performed and additional thermal cycles can be performed to activate the various implants. The recess 146 formed herein reduces the contact area between the first polysilicon gate 142 and the second polysilicon gate 144 and, therefore, provides a diffusion barrier that reduces the diffusion of impurities between the first polysilicon gate 142 and the second polysilicon gate 144. The silicide layer 170 provides a low resistance path, so the removal of the polysilicon in region 146 does not affect the series resistance of the gates.

Figure 11:
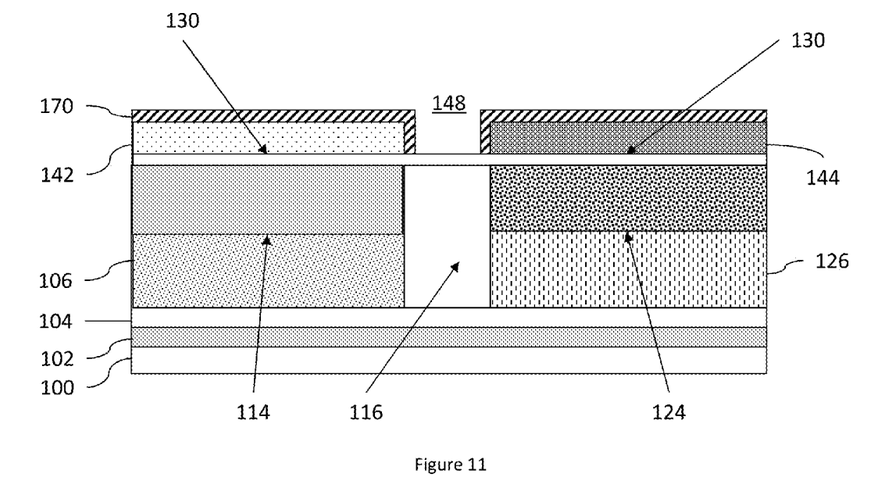
FIG. 11 is a cross-sectional schematic diagram along line A-A' in FIG. 3, illustrating embodiments herein.

In further embodiments, the material removal process performed in FIG. 5 (described above) can be altered so as to form an opening 148 completely through the gate conductor 144. Such a structure is shown in FIG. 11 after the silicide layer 170 has been formed. Because all contact between the first polysilicon gate 142 and the second polysilicon gate 144 is eliminated in the structure shown in FIG. 11, the structure potentially provides a more resistant diffusion barrier. However, a gap in the silicide will result. This gap can be shunted by overlying metal layers (not shown).

Figure 12:
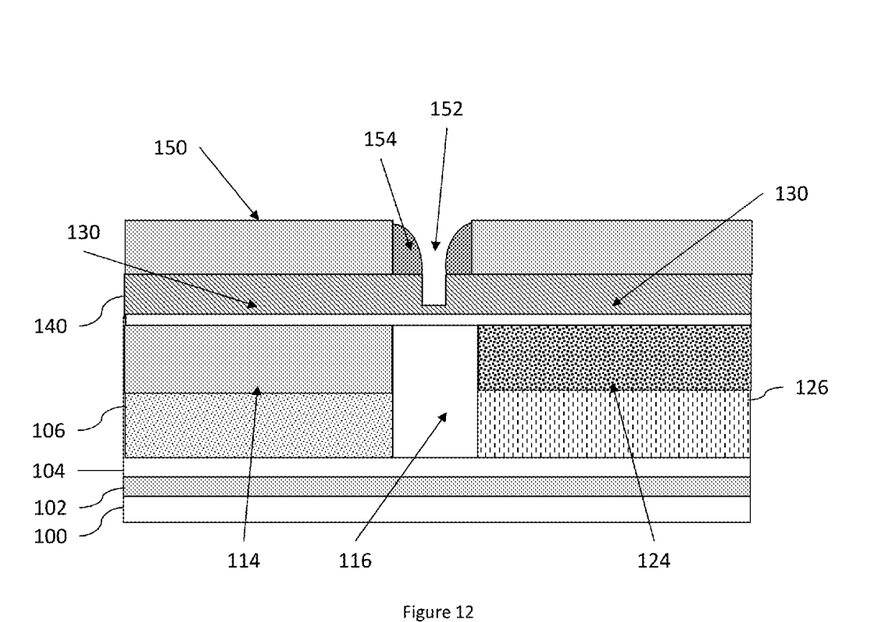
FIG. 12 is a cross-sectional schematic diagram along line A-A' in FIG. 3, illustrating embodiments herein.

FIG. 12 illustrates an alternative embodiment that utilizes sidewall spacers 154 within the mask opening 152. For purposes herein, "sidewall spacers" are structures that are well-known to those ordinarily skilled in the art and are generally formed by depositing or growing a conformal layer (such as any of the masking materials mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers. Such sidewall spacers 154 in the opening 152 reduce the size of the opening.

Figure 13:
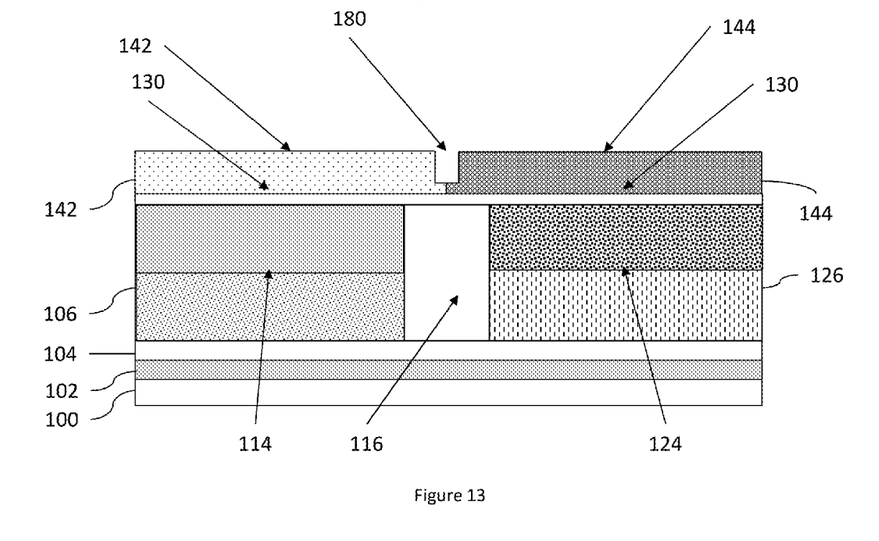
FIG. 13 is a cross-sectional schematic diagram along line A-A' in FIG. 3, illustrating embodiments herein.

As also shown in FIG. 12, a controlled material removal process is performed through the opening 152 as narrowed by the spacers 154 to form a smaller recess 180, that is more narrow than the previously discussed recess 146. Again, the power, duration, etchant, etc., used in the material removal process are selected so that a complete opening is not formed through the polysilicon gate 140, so as to eliminate any chance of damage to the shallow trench isolation region 116. After removal of the mask 150, the resulting structure is shown in FIG. 13.

Figure 14:
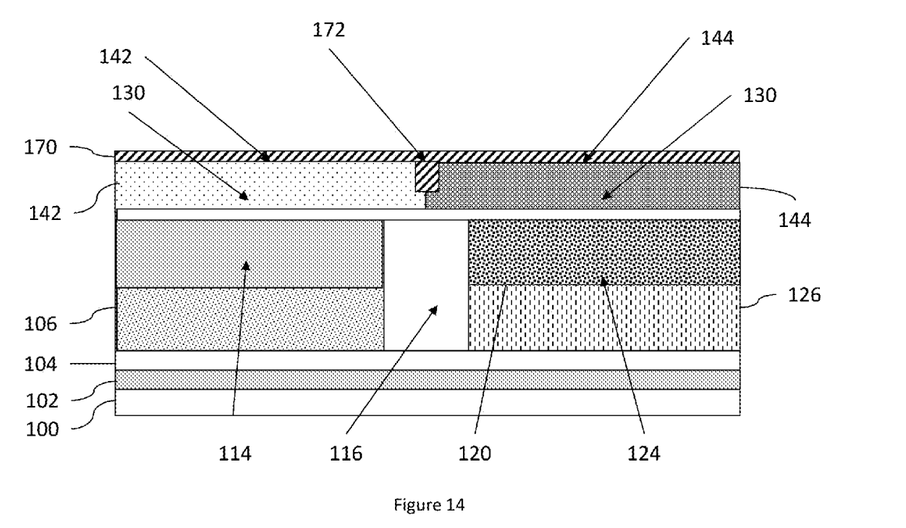
FIG. 14 is a cross-sectional schematic diagram along line A-A' in FIG. 3, illustrating embodiments herein.

After the previously discussed silicide process, the resulting structure is shown in FIG. 14. In the structure shown in FIG. 14, the smaller recess 180 is small enough to cause the silicide material to join together as a plug of silicide material 172 completely filling the smaller recess 180. As mentioned above, the reduced area of contact between the first polysilicon gate 142 and the second polysilicon gate 144, in combination with the silicide plug 172 provide a diffusion barrier that reduces the amount of impurities that travel between the different polysilicon gates.

Figure 15:
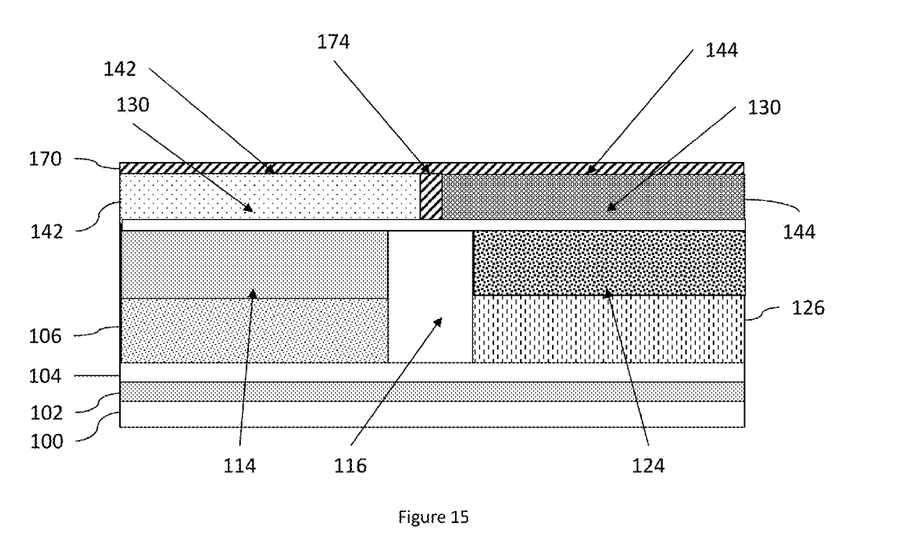
FIG. 15 is a cross-sectional schematic diagram along line A-A' in FIG. 3, illustrating embodiments herein.

FIG. 15 illustrates the resulting structure when the sidewall spacers 154 are utilized to create a smaller opening completely through the polysilicon gate 140, resulting in a plug of silicide material 174 that fully separates the first polysilicon gate conductor 142 from the second polysilicon gate conductor 144. Again, the potential for damaging the shallow trench isolation region 116 needs to be weighed against the benefit of a potentially more resistant diffusion barrier when employing this embodiment.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    patterning a polysilicon gate over two immediately adjacent, opposite polarity transistor devices;
    removing a portion of said polysilicon gate from a location where said opposite polarity transistor devices abut one another to form a recess in said polysilicon gate, said recess separating said polysilicon gate into a first polysilicon gate and a second polysilicon gate, said recess being positioned between said first polysilicon gate and said second polysilicon gate, and said recess having a reduced thickness relative to said first polysilicon gate and said second polysilicon gate;
    after forming said recess, doping said first polysilicon gate using a first polarity dopant; and
    after forming said recess, doping said second polysilicon gate using a second polarity dopant having an opposite polarity of said first polarity dopant.

2. The method according to claim 1, said removing of said portion of said polysilicon gate being performed until said recess is formed through approximately one half of said polysilicon gate.

3. The method according to claim 1, said removing of said portion of said polysilicon gate being performed until said recess is formed through approximately three quarters of said polysilicon gate.

4. The method according to claim 1, said removing of said portion of said polysilicon gate comprising etching said recess through a mask.

5. The method according to claim 1, said location where said opposite polarity transistor devices abut one another comprising a shallow trench isolation region.

6. The method according to claim 1, further comprising filling said recess with one of an insulator and a conductor.

7. A method comprising:
    patterning a polysilicon gate over two immediately adjacent, opposite polarity transistor devices;
    patterning a mask over said polysilicon gate, said mask having an opening in a location where said opposite polarity transistor devices abut one another;
    forming sidewall spacers in said opening;
    removing a portion of said polysilicon gate through said opening to form a recess in said polysilicon gate, said recess separating said polysilicon gate into a first polysilicon gate and a second polysilicon gate;
    after forming said recess, doping said first polysilicon gate using a first polarity dopant; and
    after forming said recess, doping said second polysilicon gate using a second polarity dopant having an opposite polarity of said first polarity dopant.

8. The method according to claim 7, said removing of said portion of said polysilicon gate being performed until said recess is formed through approximately one half of said polysilicon gate.

9. The method according to claim 7, said removing of said portion of said polysilicon gate being performed until said recess is formed through approximately three quarters of said polysilicon gate.

10. The method according to claim 7, said removing of said portion of said polysilicon gate comprising etching said recess through said mask.

11. The method according to claim 7, said location where said opposite polarity transistor devices abut one another comprising a shallow trench isolation region.

12. The method according to claim 7, further comprising filling said recess with one of an insulator and a conductor.

13. A method comprising:
    patterning a polysilicon gate over two immediately adjacent, opposite polarity transistor devices;
    removing a portion of said polysilicon gate from a location where said opposite polarity transistor devices abut one another to form a partial recess in said polysilicon gate, said partial recess separating said polysilicon gate into a first polysilicon gate and a second polysilicon gate, said recess being positioned between said first polysilicon gate and said second polysilicon gate, said recess having a reduced thickness relative to said first polysilicon gate and said second polysilicon gate, and said removing said portion of said polysilicon gate avoiding forming an opening completely through said polysilicon gate to form said partial recess;
    after forming said partial recess, doping said first polysilicon gate using a first polarity dopant; and
    after forming said partial recess, doping said second polysilicon gate using a second polarity dopant having an opposite polarity of said first polarity dopant.

14. The method according to claim 13, said removing of said portion of said polysilicon gate being performed until said partial recess is formed through approximately one half of said polysilicon gate.

15. The method according to claim 13, said removing of said portion of said polysilicon gate being performed until said partial recess is formed through approximately three quarters of said polysilicon gate.

16. The method according to claim 13, said removing of said portion of said polysilicon gate comprising etching said partial recess through a mask.

17. The method according to claim 13, said location where said opposite polarity transistor devices abut one another comprising a shallow trench isolation region.

18. The method according to claim 13, further comprising filling said partial recess with one of an insulator and a conductor.

* * * * *